United States Patent
Curello et al.

(10) Patent No.: US 7,560,780 B2
(45) Date of Patent: Jul. 14, 2009

(54) ACTIVE REGION SPACER FOR SEMICONDUCTOR DEVICES AND METHOD TO FORM THE SAME

(75) Inventors: Giuseppe Curello, Portland, OR (US); Ian R. Post, Portland, OR (US); Chia-Hong Jan, Portland, OR (US); Sunit Tyagi, Portland, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 11/298,095

(22) Filed: Dec. 8, 2005

(65) Prior Publication Data

US 2007/0132057 A1   Jun. 14, 2007

(51) Int. Cl.
*H01L 29/76* (2006.01)
*H01L 29/94* (2006.01)

(52) U.S. Cl. .................. 257/369; 257/374; 257/E27.06

(58) Field of Classification Search ................ 257/510, 257/369, 382, 501, 374, 384, E27.06; 438/296, 438/424, 305, 201, 300
See application file for complete search history.

(56) References Cited

U.S. PATENT DOCUMENTS

| | | | | |
|---|---|---|---|---|
| 4,998,150 A * | 3/1991 | Rodder et al. | ............... | 257/288 |
| 5,949,126 A * | 9/1999 | Dawson et al. | ............. | 257/513 |
| 5,972,758 A * | 10/1999 | Liang | ......................... | 438/294 |
| 6,022,781 A * | 2/2000 | Noble et al. | ................ | 438/296 |
| 6,121,100 A * | 9/2000 | Andideh et al. | ............. | 438/305 |
| 6,255,178 B1 * | 7/2001 | Brown et al. | ................ | 438/300 |
| 6,326,664 B1 * | 12/2001 | Chau et al. | ................... | 257/344 |
| 6,395,589 B1 * | 5/2002 | Yu | ............................. | 438/183 |
| 6,406,951 B1 * | 6/2002 | Yu | ............................. | 438/183 |
| 6,429,084 B1 * | 8/2002 | Park et al. | .................... | 438/305 |
| 6,518,155 B1 * | 2/2003 | Chau et al. | ................... | 438/592 |
| 6,943,071 B2 * | 9/2005 | Fazio et al. | ................. | 438/201 |
| 2004/0038533 A1* | 2/2004 | Liang | ......................... | 438/689 |
| 2005/0215016 A1* | 9/2005 | Yang et al. | ................... | 438/296 |

* cited by examiner

*Primary Examiner*—Thanhha Pham
(74) *Attorney, Agent, or Firm*—Blakley, Sokoloff, Taylor & Zafman LLP (57) ABSTRACT

A semiconductor device and method for its fabrication are described. An active region spacer may be formed on a top surface of an isolation region and adjacent to a sidewall of an active region. In one embodiment, the active region spacer may suppress the formation of metal pipes in the active region.

4 Claims, 12 Drawing Sheets

ACTIVE REGION SPACER FOR SEMICONDUCTOR DEVICES AND METHOD TO FORM THE SAME

BACKGROUND OF THE INVENTION

1) Field of the Invention

The invention is in the field of Semiconductor Devices.

2) Description of Related Art

For the past decade, the performance of semiconductor devices, such as Metal Oxide Semiconductor Field-Effect Transistors (MOS-FETs), has been greatly enhanced by the incorporation of metallized regions into the active portions of a semiconductor substrate, e.g. the self-aligned silicide (SALICIDE) process. The presence of such a metallized region greatly reduces the external resistance at the junction of a metal contact, extending from an array of metal interconnects, and a source/drain region.

Figure 1:
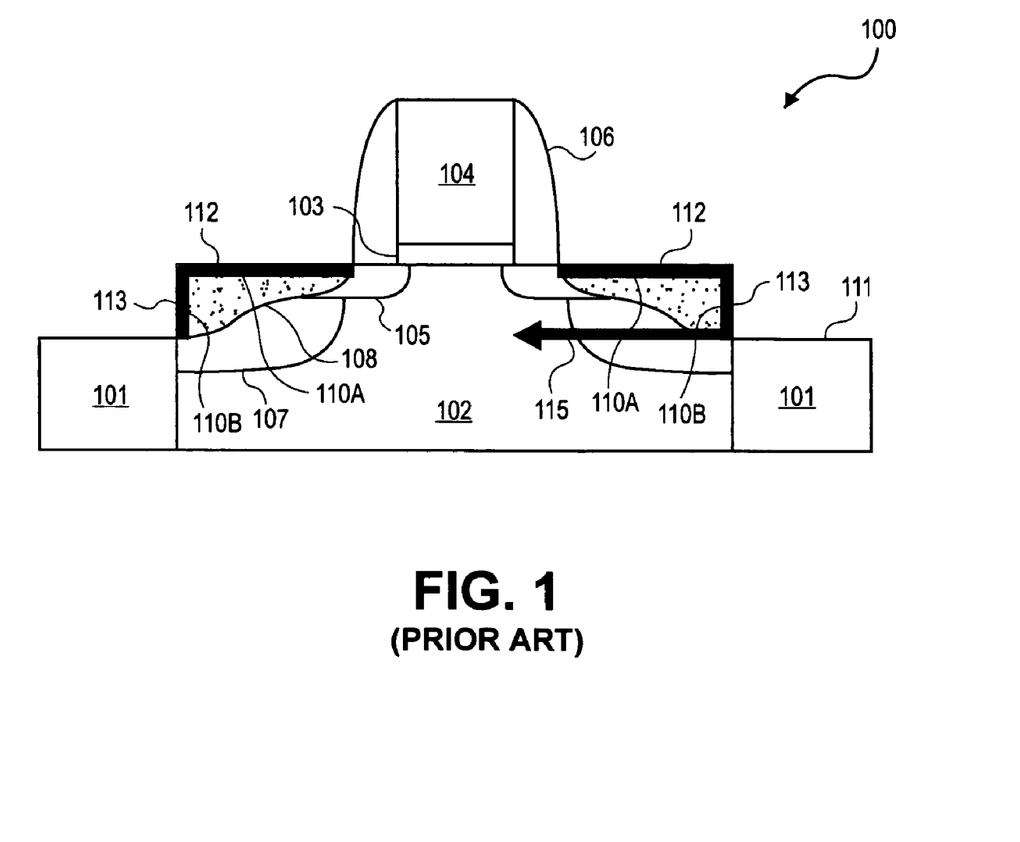
FIG. 1 illustrates a cross-sectional view of a Metal-on-Silicon Field-Effect Transistor (MOS-FET) depicting a metal pipe defect, in accordance with the prior art.

FIG. 1 depicts a typical MOS-FET 100, wherein a substrate is comprised of an isolation region 101 and an active region 102. A gate dielectric layer 103 sits above active region 102 and a gate electrode 104 sits above gate dielectric layer 103. Gate dielectric layer 103 and gate electrode 104 are isolated by gate isolation spacer 106. Tip extensions 105 and source/drain regions 107 are formed by implanting dopant atoms into active region 102. A portion of active region 102 is amorphized to form amorphized region 108. Amorphized region 108 can suppress metal pipe formation during a metallization process to form, for example, metallized regions 110A and 110B.

When the SALICIDE or metallization process metallizes the amorphous region 108 at both a top surface 112 and a sidewall 113 of active region 102 to form metallized regions 110A and 110B, metal pipe defect 115 may form and short the MOS-FET device by extending from one source/drain region 107 to another source/drain region. The formation of such a metal pipe defect can render a semiconductor device non-functional. In some cases, an extensive amorphized region is formed to suppress metal pipe defect formation. The amorphization process, however, can degrade MOS-FET performance as a result of a poor quality junction between the source/drain region and the active region. Another approach involves reducing the duration and frequency of cleans steps used during formation of a semiconductor device, in order to mitigate the extent of the recess of top surface 111 of the isolation region 101 relative to top surface 112 of the active region 102. When top surface 111 is below top surface 112, sidewall 113 of active region 102 is exposed, forming a pathway for metal pipe formation during the SALICIDE or metallization step, as described above. A reduced recess may be favorable for hindering metal pipe formation, but reducing or eliminating cleans steps can have detrimental manufacturing consequences, such as lower yield due to residue or particle defects. Thus, a method to suppress the formation of metal pipe defects in semiconductor devices is described herein.

DETAILED DESCRIPTION

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps, are not described in detail, in order to not unnecessarily obscure the present invention. Furthermore, it is understood that the various embodiments shown in the figures are illustrative representations and are not necessarily drawn to scale.

Disclosed herein are an active region spacer and a method to form such a spacer. Formation of the active region spacer prior a SALICIDE or metallization process may protect the active region from metallization via the active region sidewall, eliminating a pathway for metal pipe defect formation. Metal pipe defect formation can be detrimental to the performance of a semiconductor device. For example, in a MOS-FET a metal pipe defect that bridges a source region and a drain region can short the device, rendering useless the transistor characteristics of the MOS-FET. For semiconductor devices comprised of a substrate wherein isolation regions and active regions have been formed, metal pipe defect formation may be more likely to occur in devices where the top surface of an isolation region has been recessed below the top surface of an active region prior to the SALICIDE or metallization process. Amorphization of a portion of the active region prior to the metallization step can be effective for suppressing metal pipe defect formation, but can degrade the performance of the overall device. An active region spacer can protect the active region sidewall and hinder access of metal pipe formation, diminishing the need for amorphization.

By forming an active region spacer following a series of wet chemical cleans but prior to the metallization step, such a pathway may be blocked regardless of the extent of the recess of the top surface of an isolation region relative to the top surface of an active region. In the fabrication of semiconductor devices, wet chemical cleans are often employed to remove sacrificial layers or to remove residues and particles that form during the fabrication process. Such wet chemical cleans may recess an isolation layer, ultimately exposing a sidewall of an active region and thus creating a pathway for metal pipe formation if not protected with an active region spacer.

Active region sidewall spacers for are semiconductor devices that incorporate raised active regions formed prior to a metallization step are also considered herein. An active region sidewall may be exposed by a raised active region. An active region sidewall spacer formed adjacent the raised active region prior to metallization of the raised active region may hinder metal pipe defect formation.

The use of an active region spacer is considered as a method to block metal pipe defect formation in any case where the top surface of an isolation region is below the top surface of an active region at the time of the SALICIDE or metallization process step, i.e. in any case where an active region sidewall is formed. Furthermore, by incorporating an active region spacer into a semiconductor device, it may be possible to reduce, and even eliminate, the need for amorphization of the active region prior to metallization, possibly enhancing the performance of such a device.

Figure 2A:
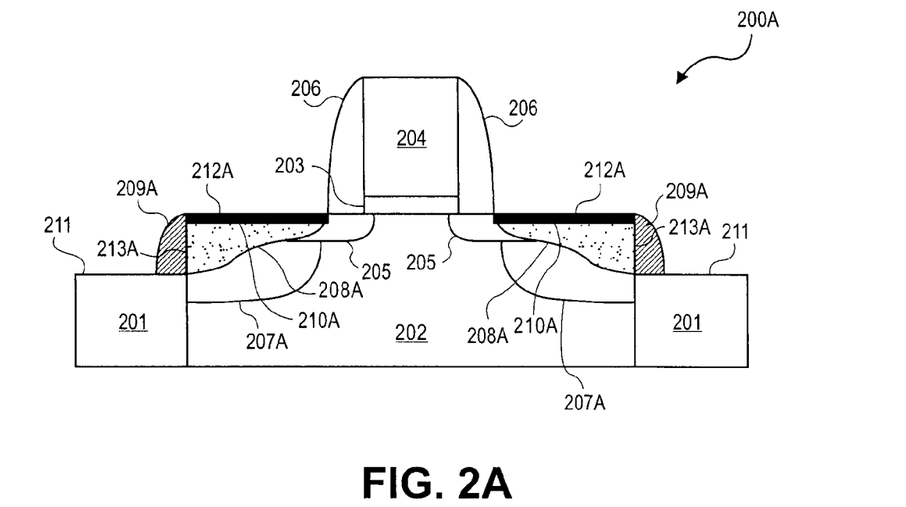
FIGS. 2A-B illustrate cross-sectional views of MOS-FETs with active region spacers, in accordance with an embodiment of the present invention.

An active region spacer may be used for the fabrication of a semiconductor device involving a substrate comprised of an active region and an isolation region wherein the top surface of the isolation region has been recessed below the top surface of the active region. In accordance with an embodiment of the present invention, a MOS-FET 200A is formed on a substrate comprised of an isolation region 201 and an active region 202, as shown in FIG. 2A. MOS-FET 200A is comprised of a gate dielectric layer 203, a gate electrode 204, a tip extension region 205, a gate isolation spacer 206, a source/drain region 207A, an amorphized region 208A, and a metallized region 210A. In one embodiment, isolation region 201 has a top surface 211 and active region 202 has a top surface 212A, wherein top surface 211 of isolation region 201 is recessed below top surface 212A of active region 202, forming a sidewall 213A of active region 202. Active region spacer 209A is formed on recessed top surface 211 of isolation region 201 and adjacent to sidewall 213A of active region 202. In an embodiment, active region spacer 209A comprises a dielectric material such as silicon dioxide, silicon nitride or silicon oxynitride. Active region spacer 209A has a height and a width sufficient to seal off and protect the active region sidewall 213A. In one embodiment, active region spacer 209A is sufficient to block the formation of metal pipes via the active region sidewall 213A. In another embodiment, active region spacer 209A has a height substantially equal to the height of active region sidewall 213A and a width of at least 20 Angstroms.

Figure 2B:
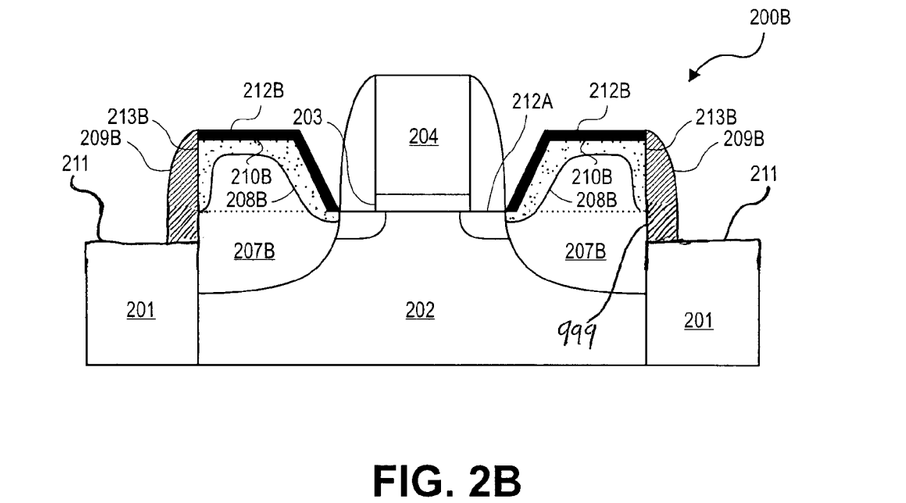

An active region spacer may also be used for the fabrication of a semiconductor device involving a raised active region and an isolation region wherein the top surface of the raised active region is above the top surface of another portion of the active region. In accordance with another embodiment of the present invention, a MOS-FET 200B comprises a raised source/drain region 207B with a metallized region 210B formed in an amorphous region 208B, as shown in FIG. 2B. A raised source/drain sidewall 213B may be formed as a result of extending the top surface 212B of the source/drain region above the top surface 212A of active region 202 where gate dielectric layer 203 is formed and, consequently, above top surface 211 of isolation region 201. Active region spacer 209B may be formed on top surface 211 of isolation region 201 and adjacent to sidewall 213B of raised source/drain region 207B. In an embodiment, active region spacer 209B comprises a dielectric material such as silicon dioxide, silicon nitride or silicon oxynitride. Active region spacer 209B has a height and a width sufficient to block the formation of metal pipes via the raised source/drain region sidewall 213B. In one embodiment, although not shown, active region spacer 209B has a height substantially equal to the height of source/drain region sidewall 213B and a width of at least 20 Angstroms. In addition to the height difference between top surface 212B of raised/source drain region 207B and top surface 211 of isolation region 201, top surface 211 may be further recessed as a consequence of various dry etching and wet chemical cleaning process steps. In an embodiment, active region spacer 209B has a height substantially equal to the height of source/drain region sidewall 213B plus the difference in height 999 between the top surface 212A of active region 202 and the top surface 211 of isolation region 201, where top surface 211 has been recessed, as depicted in FIG. 2B.

Figure 3A:
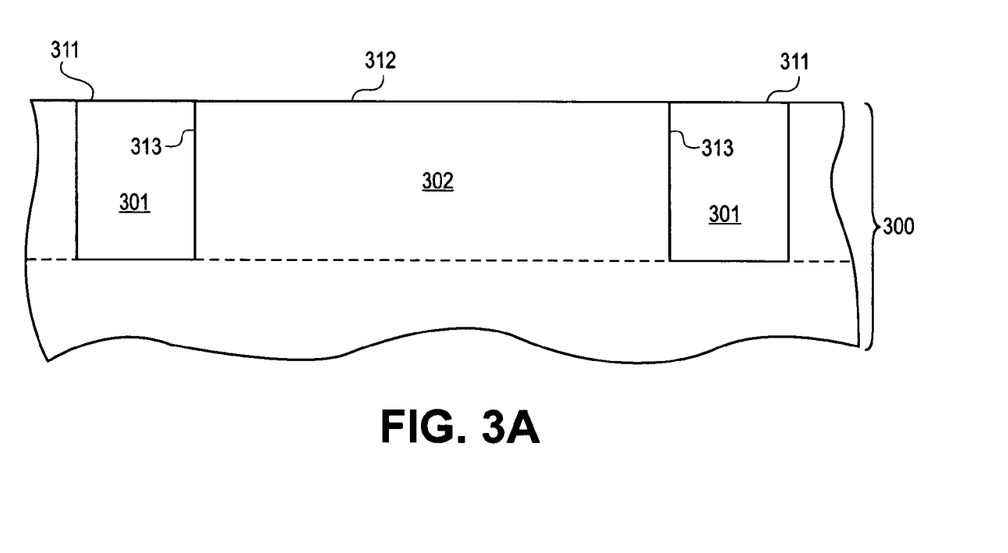
FIGS. 3A-L illustrate cross-sectional views representing the formation of a MOS-FET including the steps to form active region sidewall spacers, in accordance with an embodiment of the present invention.

As an example of one embodiment of the present invention, FIGS. 3A-L illustrate the formation of an active region spacer. Referring to FIG. 3A, substrate 300 of a semiconductor device may comprise an isolation region 301 and an active region 302. In one embodiment, isolation region 301 is formed by etching trenches into substrate 300 and subsequently filling the trenches with an insulating material by a chemical or physical vapor deposition process. In an embodiment, isolation region comprises silicon dioxide, silicon nitride, silicon oxynitride or a stack of layers thereof. In another embodiment, a silicon dioxide liner is grown thermally in the trenches of a silicon substrate prior to the chemical or physical vapor deposition of the isolation region material. In another embodiment, isolation region 301 comprises a high-k dielectric layer, such as but not limited to hafnium oxide or zirconium oxide. Active region 302 may be non-insulating and may comprise a semiconducting material. In one embodiment, active region 302 is formed by doping a crystalline silicon, germanium or silicon/germanium layer with an appropriate charge carrier, such as phosphorus, arsenic, boron, indium or a combination thereof. In another embodiment, active region 302 is comprised of a III-V material such as but not limited to gallium nitride, gallium phosphide, gallium arsenide, indium phosphide or indium antimonide. Prior to any further processing steps, top surface 311 of isolation region 301 may be above top surface 312 of active region 302, top surface 311 of isolation region 301 may be flush with top surface 312 of active region 302, as depicted in FIG. 3A, or top surface 311 of isolation region 301 may be below top surface 312 of active region 302, exposing active region sidewall 313.

An active region spacer may be formed for any semiconductor device comprised of an isolation region and an active region, wherein the top surface of the isolation region is below the top surface of the active region. In one embodiment, the semiconductor device is a MOS-FET, a bipolar transistor, a memory transistor or a micro-electronic machine (MEM) and is a planar device or a non-planar device, such as a tri-gate or double-gate transistor. For illustrative purposes, the formation of an active region spacer is described in FIGS. 3B-L in the context of formation of a MOS-FET device. As will be appreciated in the typical integrated circuit, both n- and p-channel transistors may be fabricated.

Figure 3B:
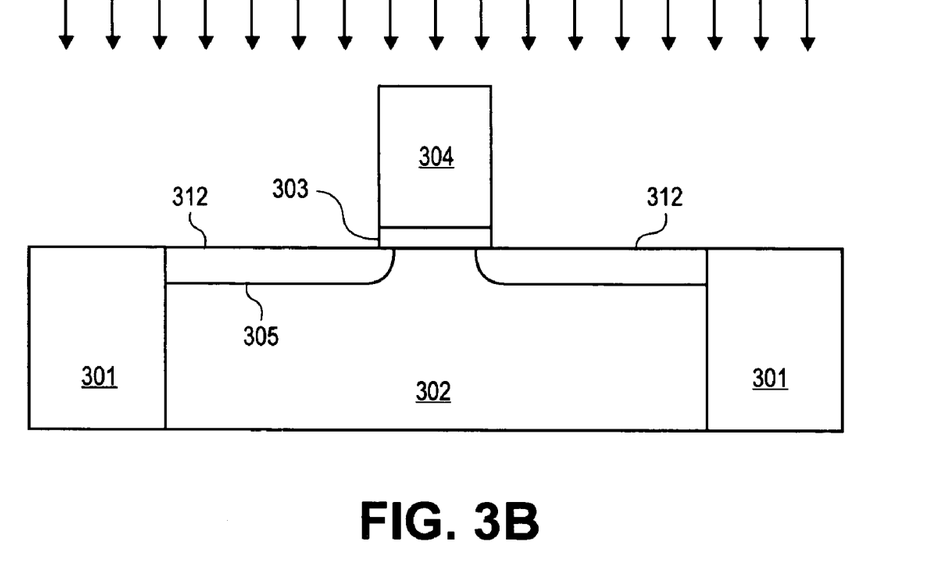

Referring to FIG. 3B, a gate dielectric layer 303 may be formed on the top surface 312 of active region 302. In one embodiment, gate dielectric layer 303 is formed by a thermal oxidation process and is comprised of silicon dioxide or silicon oxynitride. In another embodiment, gate dielectric layer 303 is formed by chemical vapor deposition or atomic layer deposition and is comprised of a high-k dielectric layer such as, but not limited to, hafnium oxide, zirconium oxide, hafnium silicate, hafnium oxynitride or lanthanum oxide.

A gate electrode 304 may be formed above gate dielectric layer 303, as is also illustrated in FIG. 3B. In one embodiment, gate electrode 304 is comprised of a polycrystalline silicon gate electrode, wherein the charge carriers are implanted during the tip and source/drain implant steps described below. In another embodiment, gate electrode 304 is comprised of a metal layer such as, but not limited to, metal nitrides, metal carbides, hafnium, zirconium, titanium, tantalum, aluminum, ruthenium, palladium, platinum, cobalt, nickel, and conductive metal oxides, e.g. ruthenium oxide. In one embodiment, a masking layer is retained above gate electrode 304.

A tip extension 305 may be formed by implanting charge carrier atoms into active region 302, as depicted in FIG. 3B. Gate electrode 304 may act to mask a portion of active region 302, forming self-aligned tip extensions 305. In one embodiment, boron, arsenic, phosphorus, indium or a combination thereof is implanted into active region 302 to form tip extension 305.

Figure 3C:
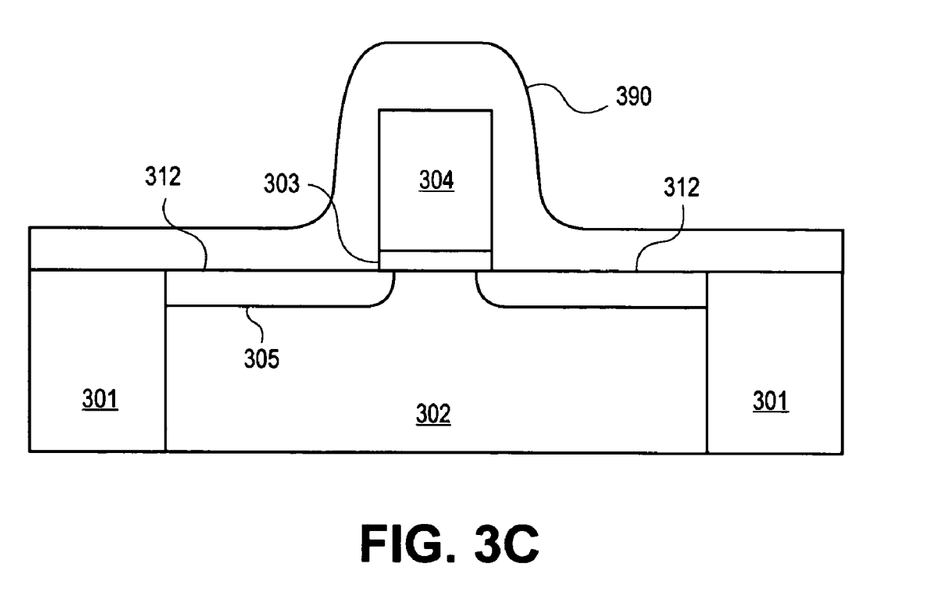
Figure 3D:
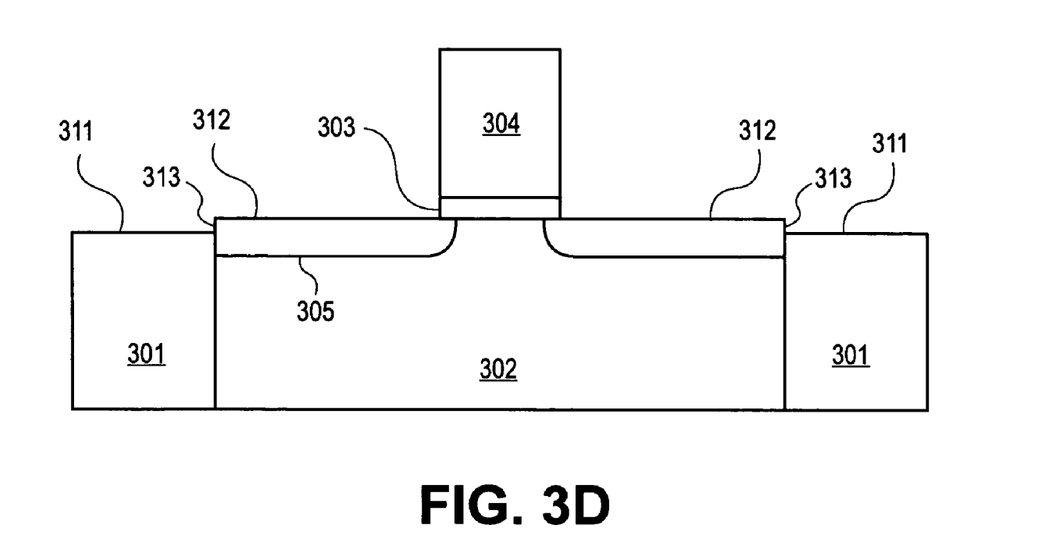

In an embodiment of the present invention, the structure in FIG. 3B is masked with a sacrificial masking layer 390, such as a photo-resist layer, while a different tip extension is formed in another device, e.g. in complimentary metal-on-silicon (CMOS) FET processing, as depicted in FIG. 3C. The sacrificial masking layer 390 may then be removed with a wet chemical cleaning process. In one embodiment, the wet chemical clean comprises an aqueous solution of hydrofluoric acid, ammonium fluoride or both. Top surface 311 of isolation region 301 may be recessed by such a wet chemical clean. In a particular embodiment, top surface 311 is recessed below top surface 312 of active region 302 during the wet chemical clean, forming or further exposing sidewall 313 of active region 302, as shown in FIG. 3D.

A gate isolation spacer may then be formed by any suitable technique. In one embodiment, referring to FIG. 3E, a layer 320 is deposited by a chemical vapor deposition process and is conformal with structure formed in 3D, covering at least top surface 311 of isolation region 301, top surface 312 of active region 302 and gate electrode 304. In an embodiment, layer 320 is comprised of an insulating layer. In a particular embodiment, layer 320 is comprised of silicon dioxide, silicon nitride, silicon oxynitride or carbon-doped silicon nitride and is between 200 and 800 Angstroms thick. In another embodiment, layer 320 is between 400 and 500 Angstroms thick. The thickness of layer 320 may be selected to determine the final width of gate isolation spacer 306, described below.

Figure 3E:
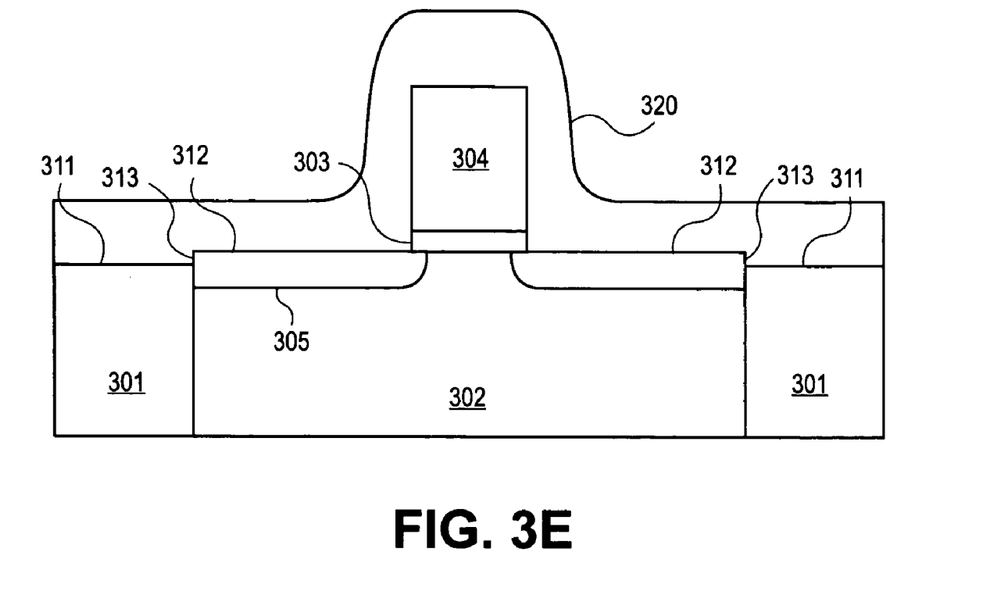
Figure 3F:
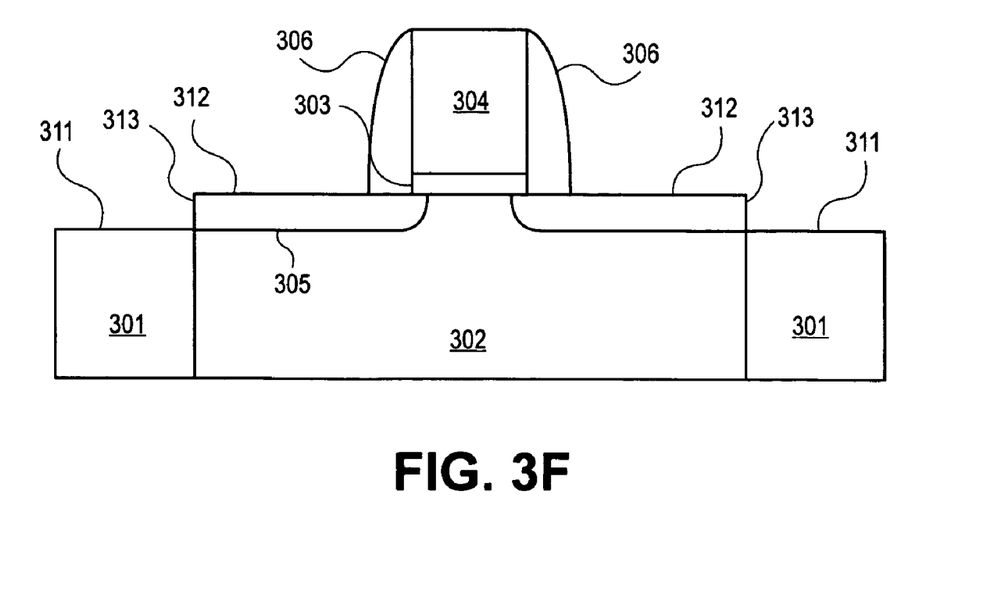

Referring to FIG. 3F, to form gate isolation spacer 306, layer 320 from above may be dry etched. In one embodiment, layer 320 is dry etched by a remote plasma etch process or an active ion etch process. Gate isolation spacer 306 may sit above top surface 312 of active region 302 and may have a width at top surface 312 substantially equal to the original thickness of layer 320. In a particular embodiment, the width of gate isolation spacer 306 at top surface 312 is between 200 and 800 Angstroms. In another embodiment, the width of gate isolation spacer 306 at top surface 312 is between 400 and 500 Angstroms. In one embodiment, gate isolation spacer 306 forms a hermetic seal with gate electrode 304 and top surface 312 to encapsulate gate dielectric layer 303.

A wet chemical cleaning process step comprising the application of an aqueous solution of hydrofluoric acid, ammonium fluoride or both may follow the dry etch process to form gate isolation spacer 306. In one embodiment, the process of dry etching layer 320 to form gate isolation spacer 306, the wet chemical clean step following the dry etch process or a combination of both recesses top surface 311 of isolation region 301 below top surface 312 of active region 302, forming or further exposing sidewall 313, as illustrated in FIG. 3F.

Figure 3G:
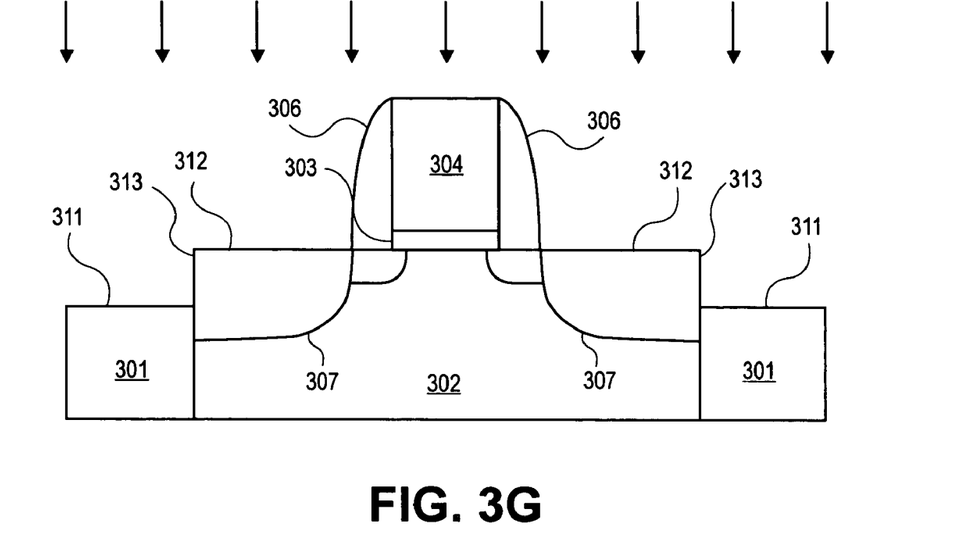

Source and drain regions may then be formed by implanting charge carrier atoms into active region 302, as depicted in FIG. 3G. Gate isolation spacers 306 and gate electrode 304 may act to mask a portion of active region 302, forming self-aligned source/drain region 307. In effect, the thickness of gate isolation spacer 306 may play a role in dictating the dimensions of source/drain region 307. In one embodiment, boron, arsenic, phosphorus, indium or a combination thereof is implanted into active region 302 to form source/drain region 307. A wet chemical cleaning process step comprising the application of an aqueous solution of hydrofluoric acid, ammonium fluoride or both may follow the source/drain implant step to form source/drain region 307. In one embodiment, the wet chemical clean recesses top surface 311 of isolation region 301 below top surface 312 of active region 302, forming or further exposing sidewall 313, as illustrated in FIG. 3G.

In an embodiment of the present invention, the structure in FIG. 3E is masked with a sacrificial masking layer, such as a photo-resist layer, while a different source/drain region is formed in another device, e.g. in complimentary metal-on-silicon (CMOS) FET processing. The sacrificial masking layer may then be removed with a wet chemical cleaning process. In one embodiment, the wet chemical clean comprises an aqueous solution of hydrofluoric acid, ammonium fluoride or both. Top surface 311 of isolation region 311 may be recessed such a wet chemical clean. In a particular embodiment, top surface 311 is recessed below top surface 312 of active region 302 during the wet chemical clean, forming or further exposing sidewall 313 of active region 302.

In preparation for metallizing the surface of the source/drain regions, a portion of the active region may be amorphized. This amorphized region may aid in blocking the formation of metal pipe defects during or following the metallization process. In an embodiment of the present invention, the extent of amorphization is reduced or even eliminated if active region spacers are formed to block the formation of metal pipe defects. In another embodiment, the amorphization step is carried out after the formation of active region spacers.

Figure 3H:
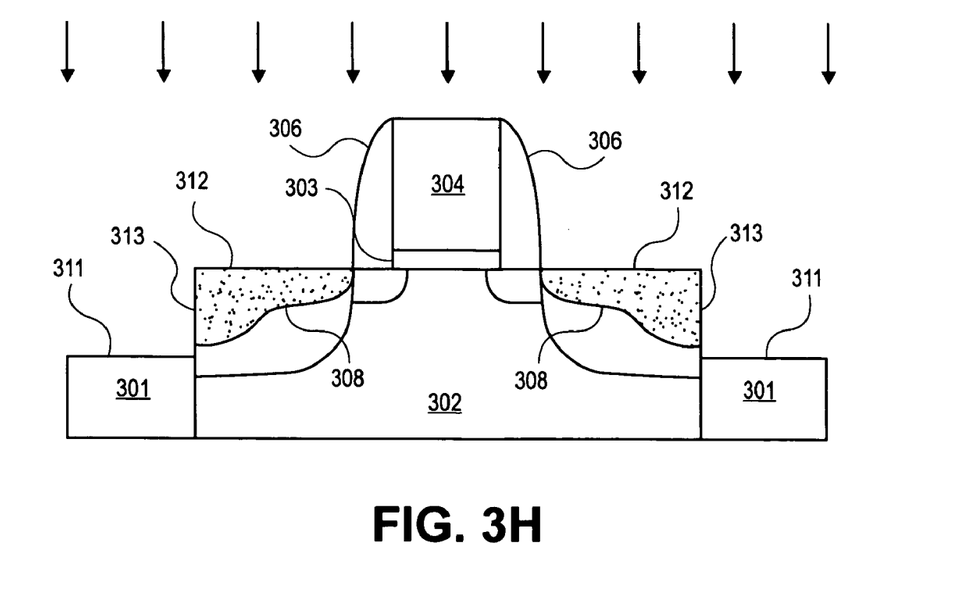

As depicted in FIG. 3H, amorphous regions 308 in active region 302 may be formed by an amorphizing implant. In one embodiment, germanium is implanted at a dose of $1 \times 10^{14}$-$1 \times 10^{15}$ atoms/cm$^2$ with an energy of 10-30 keV to form an amorphous region 308 with a depth of 100-800 Angstroms below top surface 312 of active region 302. In another embodiment, silicon is implanted at a dose of $5 \times 10^{14}$-$5 \times 10^{15}$ atoms/cm$^2$ with an energy of 20-60 keV to form an amorphous region 308 with a depth of 100-800 Angstroms below top surface 312 of active region 302. In another embodiment, the amorphizing implant step to form amorphized region 308 is eliminated.

A wet chemical cleaning process step comprising the application of an aqueous solution of hydrofluoric acid, ammonium fluoride or both may follow the formation of amorphous region 308. In one embodiment, the wet chemical clean recesses top surface 311 of isolation region 301 below top surface 312 of active region 302, forming or further exposing sidewall 313, as illustrated in FIG. 3H.

In an embodiment of the present invention, the structure in FIG. 3H requires metallization of the surface of the source/drain regions to later form a good junction when contacts are made to the source/drain regions. The dry etch and wet clean processes described above may contribute to a recess of the top surface of an isolation region below the top surface of an active region, thereby exposing a sidewall of the active region. Metallization at this stage may lead to the formation of metal pipe defects as formed via the exposed sidewall of the active region. In an embodiment of the present invention, an active region spacer is formed by any suitable technique prior to the metallization step and blocks the formation of metal pipe defects.

Figure 3I:
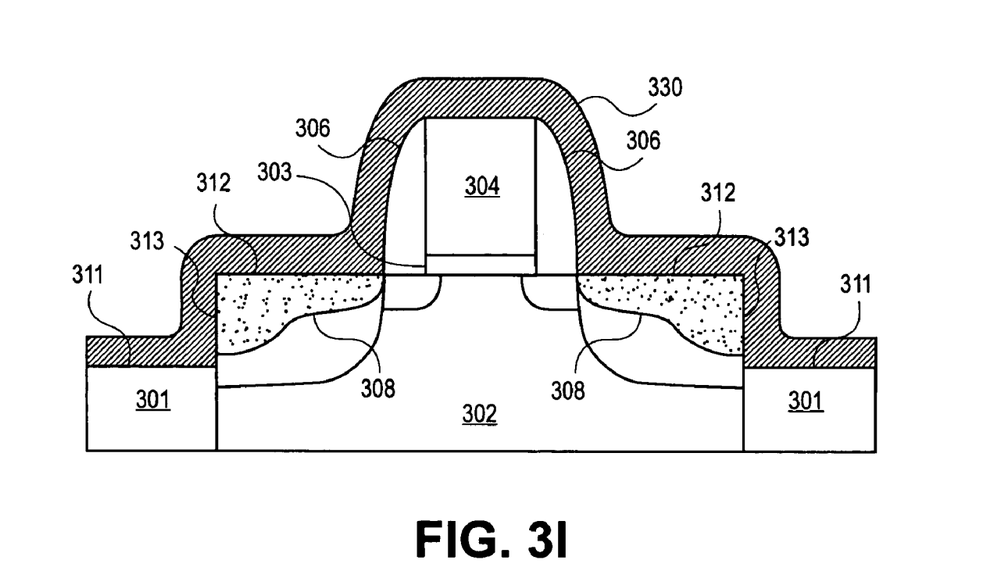

In a particular embodiment, referring to FIG. 3I, a layer 330 is deposited by a chemical vapor deposition process and is conformal with structure formed in 3H, covering at least top surface 311 of isolation region 301 and sidewall 313 of active region 302, and going up and over top surface 312 of active region 302. Layer 330 may be comprised of an insulating layer. In a particular embodiment, layer 330 is comprised of silicon dioxide, silicon nitride, silicon oxynitride or carbon-doped silicon nitride and is between 20 and 200 Angstroms thick. In another embodiment, layer 330 is between 50 and 100 Angstroms thick. The thickness of layer 330 may be selected to determine the final width of the active region spacer, as described below.

Figure 3J:
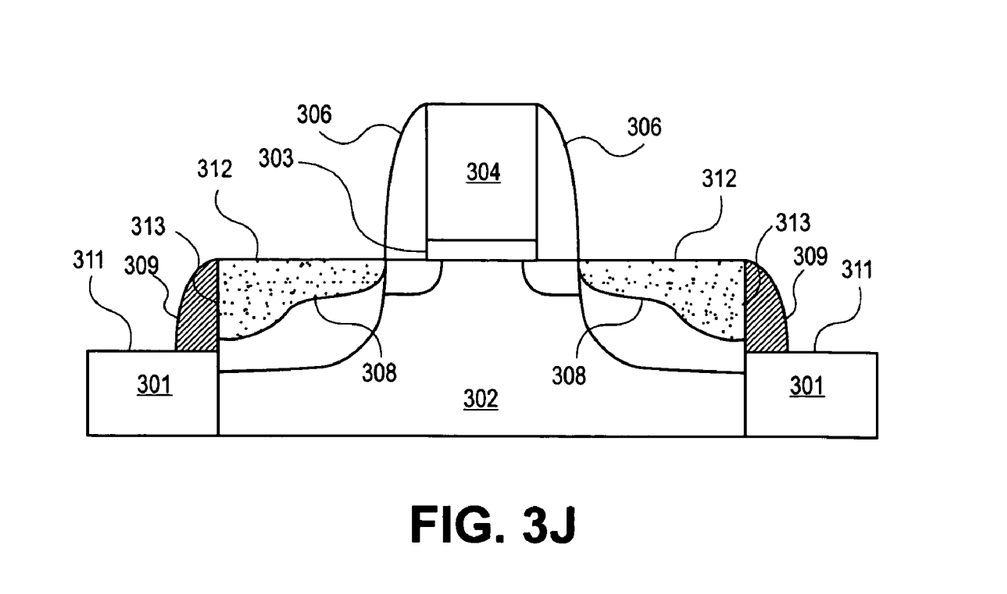

Referring to FIG. 3J, to form active region spacer 309, layer 330 from above may be dry etched. In one embodiment, layer 330 is dry etched by a remote plasma etch process or an active ion etch process. Active region spacer 309 may sit above top surface 311 of isolation region 301 and may have a width at top surface 311 substantially equal to the original thickness of layer 330. In a particular embodiment, active region spacer 309 has a width at top surface 311 between 20 and 200 Angstroms. In another embodiment, active region spacer 309 has a width at top surface 311 between 50 and 100 Angstroms and a height substantially equal to adjacent sidewall 313. In one embodiment, active region spacer 309 sits directly above top surface 311 of isolation region 301 and directly adjacent to sidewall 313 of active region 302 and forms a hermetic seal with top surface 311 and sidewall 313. Active region spacer 309 may be substantially robust to block metal pipe defect formation via active region sidewall 313.

With the active region spacer in place, sealing off the active region sidewalls, metallization of the source/drain regions may be carried out with little to no risk of metal pipe defect formation via the active region sidewalls. Metallization regions may be formed by any suitable technique. In one embodiment, metallization of the surfaces of the source/drain regions are formed with a first step comprising chemical vapor deposition, physical vapor deposition or atomic layer deposition of a metal film atop the structure formed in FIG. 3J.

Figure 3K:
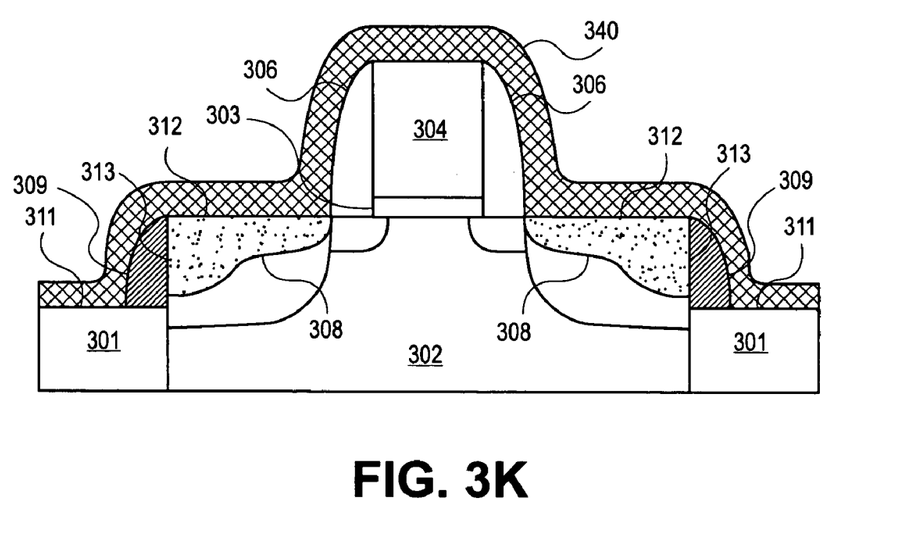

In accordance with an embodiment of the present invention, as depicted in FIG. 3K, a layer 340 is deposited over the structure formed in 3J. As illustrated, layer 340 may be deposited non-selectively, covering at least top surface 311 of isolation region 301, active region spacer 309, top surface 312 of active region 302, gate isolation spacer 306 and gate electrode 304. Alternatively, layer 340 may be deposited selectively, covering only the top surface of the source/drain regions. In one embodiment, layer 340 is comprised of a conductive layer and is comprised of nickel, cobalt, titanium, hafnium, molybdenum, platinum, or a combination thereof. In a particular embodiment, layer 340 is between 50 and 150 Angstroms thick.

Figure 3L:
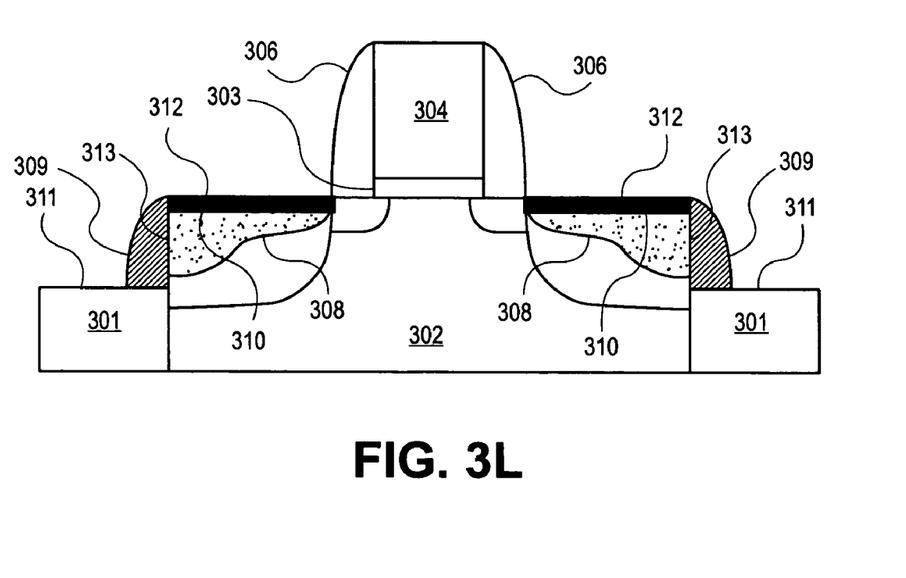

Following deposition of the metal layer, a metallized portion of the source/drain region in the active region may form at ambient conditions upon contact of the metal layer with the top surface of the source/drain regions or may form following a heating step. In one embodiment, the structure depicted in FIG. 3K is heated to a temperature of at least 350 degrees Celsius for a period of at least 1 minute. In another embodiment, the heating step is carried out with a temperature in the range between 350-450 degrees Celsius for a period of between 1-5 minutes. The heating process may cause a reaction between any exposed portion of source/drain region 307 and layer 340 to form a metallized region 310 in active region 302, as shown in FIG. 3L. In another embodiment, a heating step is not required for metallization to occur. In one embodiment, gate electrode 304 is comprised of polysilicon wherein a top portion of the polysilicon is metallized during the metallization step. Unreacted portions of layer 340 may be removed by an aqueous wet etchant comprised of, for example, sulfuric acid and hydrogen peroxide. In an embodiment, resulting metallized region 310 is comprised of a metal silicide, a metal germanide or a metal silicide/germanide, wherein the metal is comprised of nickel, cobalt, titanium, hafnium, molybdenum, platinum or a combination thereof. In accordance with an embodiment of the present invention, the metallized portions 310 are formed with no metallization occurring via the sidewalls 313 of the active regions 302 as a result of the protection afforded by active region spacers 309. Hence, the formation of metal pipe defect formation via the active region sidewalls may be mitigated or hindered altogether.

Figure 4:
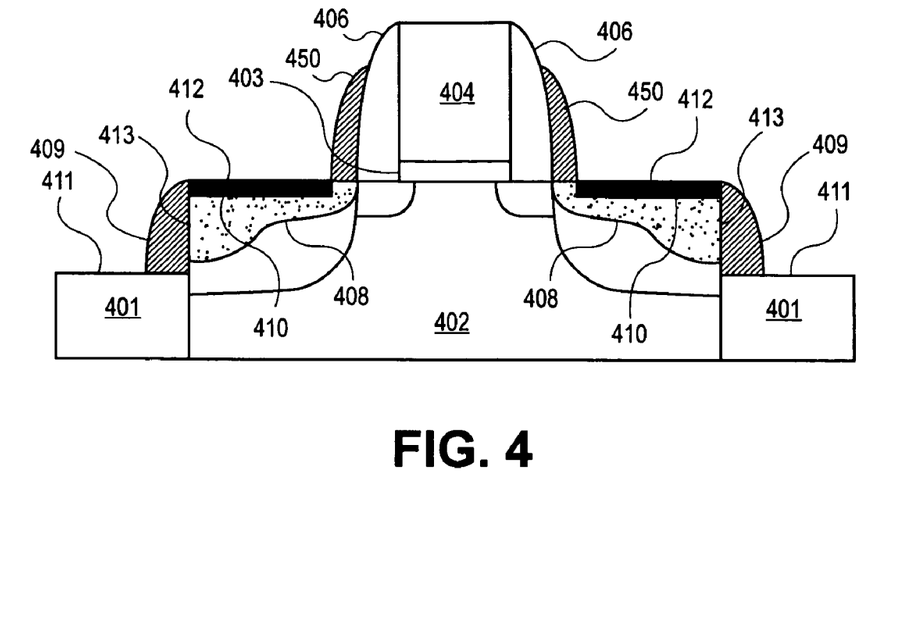
FIG. 4 illustrates a cross-sectional view of a MOS-FET with active region spacers accompanied by formation of a residual spacer, in accordance with an embodiment of the present invention.

In another embodiment of the present invention, the formation of the active region spacer is not as clean as described above in conjunction with FIG. 3J. In a particular embodiment, when layer 330 is etched to form active region spacer 309, an additional spacer is formed adjacent to the gate isolation spacer. FIG. 4 illustrates an embodiment of the present invention wherein formation of active region spacer 409 is accompanied by formation of a residual spacer 450 beside gate isolation spacer 406. In an embodiment, residual second gate isolation spacer 450 sits above top surface 412 of active region 402 and is directly adjacent to gate isolation spacer 406. The metallization step to form metallized region 410 may be carried as described above, with little to no impact from the residual spacer 450.

Figure 5:
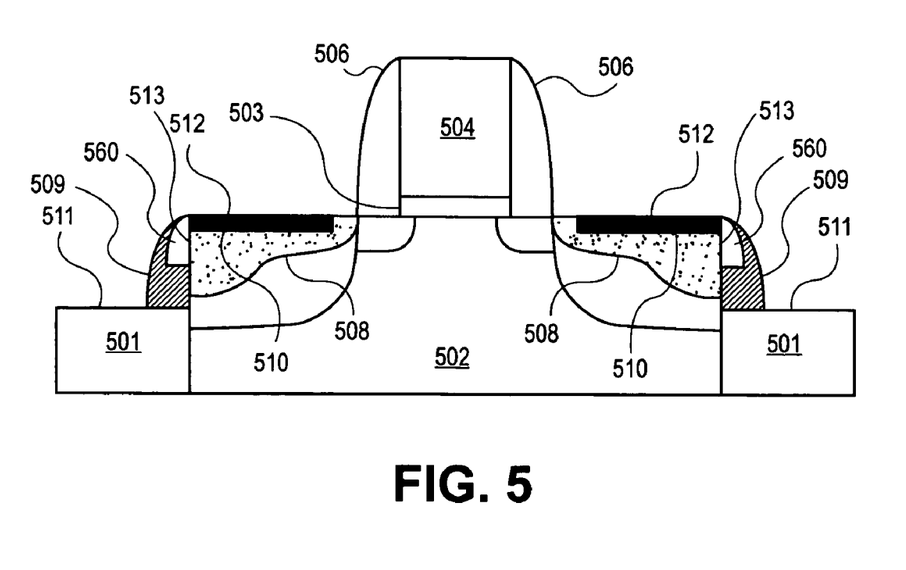
FIG. 5 illustrates a cross-sectional view of a MOS-FET with active region spacers, wherein a preliminary active region spacer is incorporated into the actual active region spacer, in accordance with an embodiment of the present invention.

In another embodiment of the present invention, the formation of the gate isolation spacer is not as clean as described above in conjunction with FIG. 3F. In a particular embodiment, when layer 320 is etched to form gate isolation spacer 306, a preliminary active region spacer is formed. FIG. 5 depicts an embodiment of the present invention wherein formation of gate isolation spacer 506 is accompanied by formation of a preliminary active region spacer 560 directly adjacent to active region sidewall 509. The formation of the actual active region spacer 509 may be carried out as described above, with little to no impact from the preliminary active region spacer 560, which may be incorporated into active region spacer 509, as shown in FIG. 5.

In accordance with another embodiment of the present invention, a semiconductor device comprises a raised portion of an active region wherein the top surface of the raised portion of the active region is above the top surface of another portion of the active region. An active region sidewall may be formed as a result of extending the top surface of an active region above the top surface of the original substrate and, consequently, above the top surface of an isolation region. As an example of one embodiment of the present invention, FIGS. 6A-D illustrate the formation of an active region spacer on a semiconductor device comprising a raised active region is described below in the context of formation of a MOS-FET device with raised source/drain regions, wherein the top surface of the raised source/drain regions is above the top surface of the portion of the active region whereon a gate dielectric layer is formed.

Figure 6A:
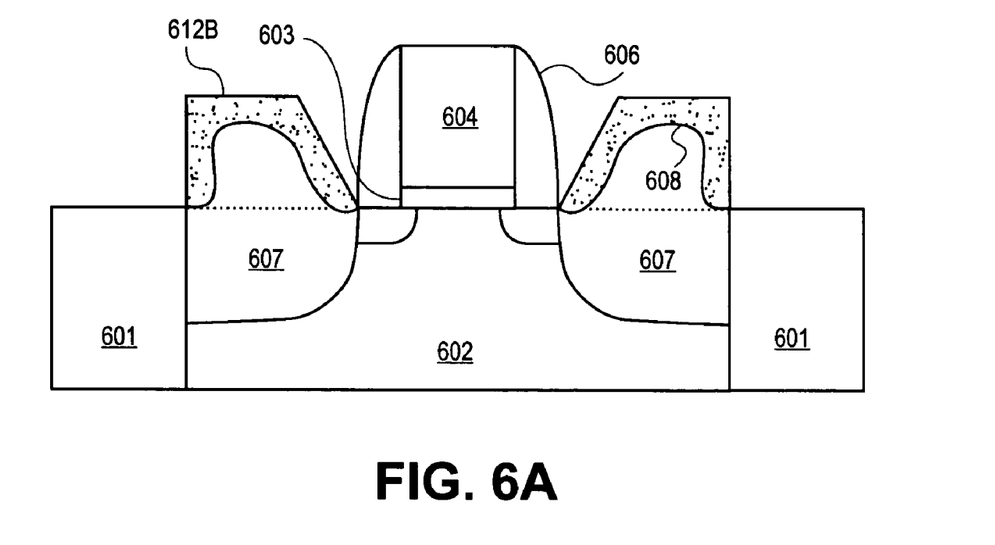
FIGS. 6A-D illustrate cross-sectional views representing the formation of a MOS-FET with a raised source/drain region and the steps to form active region sidewall spacers, in accordance with an embodiment of the present invention.
Figure 6B:
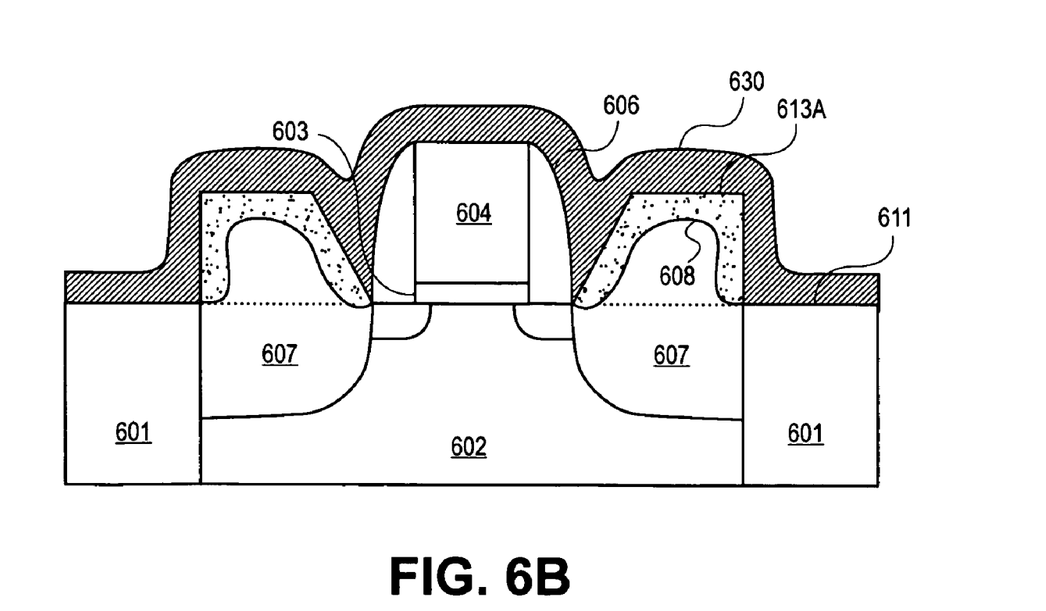

As depicted in FIG. 6A, a source/drain region may be raised following formation of the gate isolation spacers, but before the metallization process step. In a particular embodiment, top surface 612B of raised source/drain region 607 is above top surface 612A of active region 602 where gate dielectric layer 603 is formed and adjacent to gate isolation spacer 606. Raised source/drain region 607 may be grown epitaxially and may comprise silicon, germanium, silicon/germanium or a III-V compound semiconducting material. In one embodiment, cavities are first etched into an active region and the raised source/drain regions are subsequently grown epitaxially, filling the cavities. Raised source/drain region 607 may comprise an exposed source/drain region sidewall, which may be susceptible to metallization and metal pipe defect formation if not sealed off by an active region spacer. In one embodiment of the present invention, raised source/drain region 607 is fully or partially amorphized to form amorphous region 608, as shown in FIG. 6A. In another embodiment, the amorphization step is eliminated. In another embodiment, the amorphization step is carried out after the formation of active region spacers.

An active region spacer may be formed for the structure shown in FIG. 6A by any suitable technique prior to the metallization step. In a particular embodiment, referring to FIG. 6B, a layer 630 is deposited by a chemical vapor deposition process and is conformal with the structure formed in 6A, covering at least top surface 611 of isolation region 601 and sidewall 613A of raised source/drain region 607, and going up and over top surface 612B of raised source/drain region 607. In an embodiment, layer 630 is an insulating layer comprised of silicon dioxide, silicon nitride, silicon oxynitride or carbon-doped silicon nitride and is between 20 and 200 Angstroms thick. In another embodiment, layer 630 is between 50 and 100 Angstroms thick. The thickness of layer 630 may be selected to determine the final width of the active region spacer, as described below.

Figure 6C:
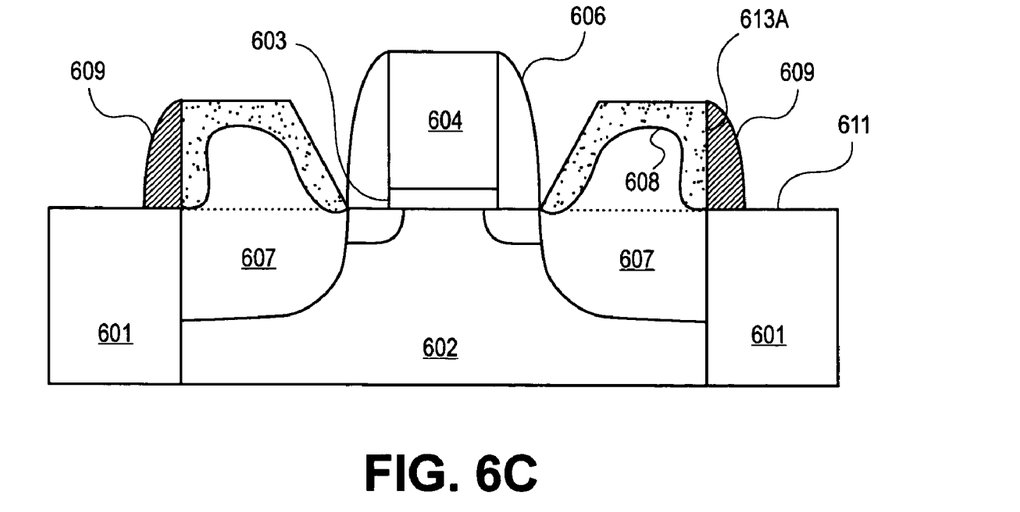

Referring to FIG. 6C, to form active region spacer 609, layer 630 may be dry etched. In one embodiment, layer 630 is dry etched by a remote plasma etch process or an active ion etch process. Active region spacer 609 may sit above top surface 611 of isolation region 601 and may have a width at top surface 611 substantially equal to the original thickness of layer 630. In a particular embodiment, active region spacer 609 has a width at top surface 611 between 20 and 200 Angstroms. In another embodiment, active region spacer 609 has a width at top surface 611 between 50 and 100 Angstroms and a height substantially equal to sidewall 613A of raised source/drain region 607. In one embodiment, active region spacer 609 sits directly above top surface 611 of isolation region 601 and directly adjacent to sidewall 613A of raised source/drain region 607 and forms a hermetic seal with top surface 611 and sidewall 613A. Active region spacer 609 may be substantially robust to block metal pipe defect formation via raised source/drain sidewall 613A.

Figure 6D:
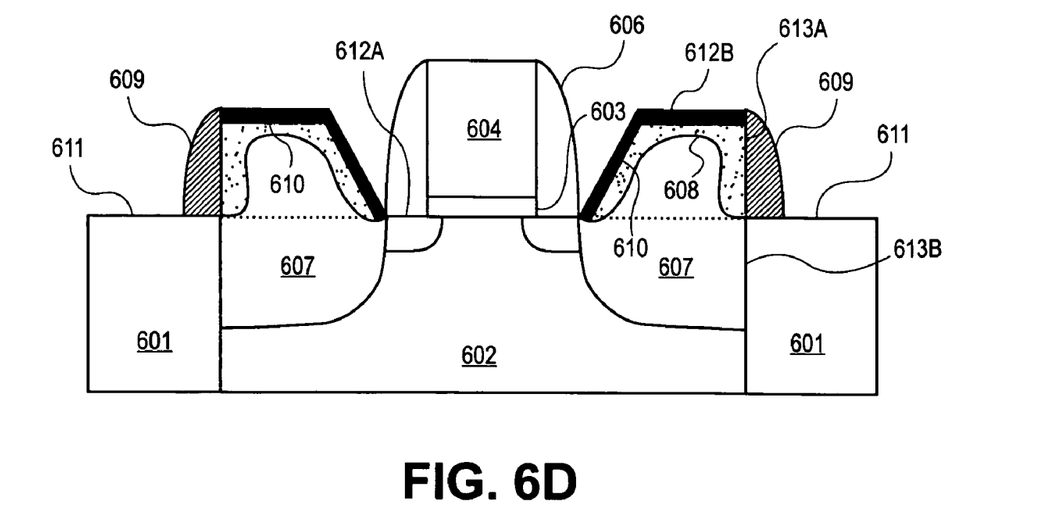

As depicted in FIG. 6D, metallized region 610 may be formed in raised source/drain region 607 in a manner similar to that described above. In an embodiment, metallized region 610 is comprised of a metal silicide, a metal germanide or a metal silicide/germanide, wherein the metal is comprised of nickel, cobalt, titanium, hafnium, molybdenum, platinum or a combination thereof. In one embodiment, gate electrode 604 is comprised of polysilicon wherein a top portion of the polysilicon is metallized during the metallization step. In accordance with an embodiment of the present invention, the metallized portion 610 is formed with no metallization occurring via the sidewall 613A of raised source/drain region 607 as a result of the protection afforded by active region spacer 609. In another embodiment of the present invention, in addition to the height difference between the top surface 612B of raised/source drain region 607 and top surface 611 of isolation region 601, top surface 611 is further recessed to expose sidewall 613B of active region 602 as a consequence of various dry etch or wet chemical cleaning process steps, such as those described in detail above. An active region spacer may be formed on top surface 611 of isolation region 601 and adjacent to sidewall 613A of raised source/drain region 607 and also adjacent to any active region sidewall 613B exposed as a consequence of recessing top surface 611 of isolation region 601 below top surface 612A of active region 602, which may have occurred as a result of various dry etching and wet chemical cleaning process steps.

Thus, semiconductor devices incorporating active region spacers and a method to form such devices and active region spacers have been described. In one embodiment, the active region spacer sits above the top surface of an isolation region and adjacent to the active region. The active region spacer may protect the sidewall of the active region during a metallization process, limiting the metallization process to the top surface of the active region. In an embodiment, metal pipe defects are not formed as a result of the protection provided by the active region spacer. In another embodiment, the extent of amorphization prior to a metallization step is reduced or eliminated, since metal pipe defect suppression is accomplished through protection of the active region sidewall by the active region spacer.

What is claimed is:

1. A semiconductor device comprising:
   a substrate having an isolation region adjacent to an active region, said isolation region having a top surface, a first portion of said active region having a top surface above a top surface of a second portion of said active region, and said top surface of said isolation region recessed below both said top surfaces of said first and second portions of said active region, forming a continuous sidewall of said first and second portions of said active region;
   a spacer formed on said top surface of said isolation region and adjacent to said continuous sidewall of said first and second portions of said active region; and
   a gate dielectric layer formed on a portion of said top surface of said second portion of said active region.

2. The device of claim 1, wherein said spacer has a height and a width sufficient to seal off and protect said continuous sidewall of said first and second portions of said active region.

3. The device of claim 2, wherein said spacer has a height substantially equal to the height of said continuous sidewall of said first and second portions of said active region, and a width of at least 20 Angstroms.

4. The device of claim 1, wherein said spacer comprises a dielectric material selected from the group consisting of silicon dioxide, silicon nitride and silicon oxynitride.

* * * * *